United States Patent [19]

Ciardi

[11] Patent Number: 4,745,566
[45] Date of Patent: May 17, 1988

[54] ANGLE MODULATED WAVEFORM SYNTHESIZER

[75] Inventor: John J. Ciardi, Aloha, Oreg.

[73] Assignee: Tektronix, Inc., Beaverton, Oreg.

[21] Appl. No.: 709,154

[22] Filed: Mar. 7, 1985

[51] Int. Cl.$^4$ .......................... G06F 1/02; H03C 3/00; H03K 7/00
[52] U.S. Cl. ..................................... 364/718; 375/44; 375/46; 332/9 R; 332/16 R
[58] Field of Search .............................. 364/718–722; 84/1.01; 375/44, 46, 62, 65, 67; 332/9 R, 16 R

[56] References Cited

U.S. PATENT DOCUMENTS

| | | | |
|---|---|---|---|
| 4,114,189 | 9/1978 | Davis | 364/718 |
| 4,134,072 | 1/1979 | Bolger | 364/718 |
| 4,249,447 | 2/1981 | Tomisawa | 364/721 |
| 4,342,245 | 8/1982 | Gross | 364/718 |
| 4,438,503 | 3/1984 | White et al. | 364/721 |
| 4,558,282 | 12/1985 | Lowenschuss | 364/721 |
| 4,625,318 | 11/1986 | Snyder | 332/16 R X |
| 4,628,286 | 12/1986 | Nossen | 332/9 R |

OTHER PUBLICATIONS

T. S. Kinsel et al., "A Digital Signal Generator", IEEE Micro, vol. 1, No. 4, Nov. 1981, pp. 6–15.

Primary Examiner—Gary V. Harkcom
Assistant Examiner—Long Thanh Nguyen
Attorney, Agent, or Firm—John P. Dellett; Robert S. Hulse

[57] ABSTRACT

An angle modulated periodic waveform is synthesized by generating three digital number sequences. In a first number sequence, one number thereof is generated on each occurrence of a periodic clock signal and has a magnitude which is a selected first periodic function of the number of prior occurring clock signals. In a second number sequence, one number thereof is generated on each occurrence of the clock signal and has a magnitude which is a selected second function of prior occurring numbers of the first number sequence and an applied constant carrier waveform frequency parameter. Each number of the second number sequence is added as it is generated to a stored second address number. In the third number sequence, one number thereof is generated on each occurrence of the clock signal and has a magnitude which is a selected third periodic function of the stored second address number. Each number of the third number sequence is converted to a voltage of proportional magnitude by a digital-to-analog converter, the output of which includes the synthesized angle modulated waveform. The second function may be selectively adjusted by application of an external control signal such that the output waveform may exhibit either frequency or phase modulation.

18 Claims, 1 Drawing Sheet

ANGLE MODULATED WAVEFORM SYNTHESIZER

BACKGROUND OF THE INVENTION

The present invention relates in general to digital waveform synthesizers and in particular to a waveform synthesizer for generating angle modulated waveforms.

Digital waveform synthesizers of the prior art typically generate a sequential set of digital data representing the desired waveform. This data is applied to a digital-to-analog (D/A) converter which then produces the synthesized analog waveform of voltage magnitude varying according to the magnitude of the applied digital data. A typical such waveform synthesizer employs an offset register, an accumulator and a random access memory (RAM) wherein data representing one period of the selected waveform completely fills all RAM locations. When the RAM address is sequentially updated in selected incremental steps, the data appearing at the output terminals of the RAM varies in proportion to the magnitude of the desired synthesized analog waveform. The frequency of output waveform variation is directly proportional to both the address step size and the address update rate (i.e. system clock frequency), and inversely proportional to the RAM length. The address step size is stored in the offset register and is accumulated by the accumulator, which provides the incremental RAM addresses.

While digital waveform synthesizers of the prior art are well adapted for digitally synthesizing waveforms oscillating according to a single frequency, they are not well adapted for synthesizing angle (e.g. phase or frequency) modulated waveforms. Phase and frequency modulated waveforms oscillate according to two independant frequencies, a higher carrier frequency and a lower modulating frequency. In order to produce a phase or frequency modulated waveform, two digital waveform synthesizers, driving associated D/A converters, could be used with one synthesizing a waveform of the carrier frequency and with another synthesizing a waveform of the modulating frequency. The two analog waveforms thus synthesized could then applied to a conventional analog phase or frequency modulating circuit to produce the angle modulated waveform.

This method therefore uses two D/A converters and a conventional analog modulating circuit. The extra D/A converter and the analog modulating circuit can be expensive and can take up a comparatively large amount of space in an equipment chassis. It would be advantageous if data representing a frequency or phase modulated waveform could be sythesized entirely by digital means such that only a single D/A converter is needed to generate the analog waveform equivalent and such that no analog modulating circuit is required.

SUMMARY OF THE INVENTION

According to one aspect of the present invention, a first and a second digital waveform synthesizer are interconnected by a modulation control circuit. A first waveform synthesizer comprises a first offset register, a first accumulator and a first RAM, while a second waveform synthesizer comprises a second offset register, and second accumulator, and a second RAM. The data stored by each accumulator is used to address the associated RAM, and the first and second RAMs are programmed with data representing one period of the selected modulator and carrier waveforms respectively. A selected modulator waveform frequency parameter, stored in the first offset register, is applied to the input of the first accumulator such that each time the accumulator is strobed by a system clock pulse, the accumulator adds this parameter to the number currently stored by the first accumulator. The current address of the first RAM is thereby incremented by the amount of the selected modulator waveform frequency parameter such that the output of the first RAM varies as a periodic function of the number of clock pulses and the magnitude of the modulator waveform frequency parameter.

The time-varying output of the first digital waveform synthesizer is applied to the input of the modulation control circuit. The output of the modulation control circuit, a selected transfer function of the periodic input, is summed with a selected carrier waveform frequency parameter stored in the second offset register, and applied to the input of the second accumulator. A number stored by the second accumulator is thus incremented by this time-varying sum each time the second accumulator is strobed by a system clock pulse. The stored second accumulator number addresses the second RAM such that the data output of the second RAM is a periodic function of the current carrier waveform frequency parameter, while angle modulated according to the modulator waveform frequency parameter.

According to another aspect of the invention, the transfer function associated with the modulation control circuit may be selected such that the output of the modulation control circuit at any given time is proportional to the sum of the last two clocked outputs of the first waveform synthesizer. This causes the magnitude of the data output of the second digital waveform synthesizer to oscillate at a carrier waveform frequency proportional to the carrier waveform frequency parameter, while frequency modulated in proportion to the modulator waveform frequency parameter.

According to another aspect of the invention, the transfer function associated with the modulation control circuit may alternately be selected such that the output of the modulation control circuit at any given time is proportional to the difference between the last two clocked outputs of the first digital waveform synthesizer. This causes the magnitude of the second digital waveform synthesizer output data to oscillate at a carrier waveform frequency proportional to the carrier waveform frequency parameter, while being phase modulated in proportion to the modulator waveform frequency parameter.

According to a still further aspect of the invention, the output of the second digital waveform synthesizer is converted into an analog waveform of magnitude which varies in time according to the magnitude of the input data, with such waveform being subsequently smoothed by a filtering circuit.

It is accordingly an object of the invention to provide a new and improved method and apparatus for producing angle modulated waveforms wherein the carrier and modulator waveform frequencies phase and frequency constants and modulating and carrier waveform types are all controlled by applied digital data.

It is another object of the invention to provide a new and improved method and apparatus for producing an angle modulated waveform wherein the angle modulation may be selectively of the phase or frequency modulation type.

The subject matter of the present invention is particularly pointed out and distinctly claimed in the concluding portion of this specification. However, both the organization and method of operation, together with further advantages and objects of the present invention, may best be understood by reference to the following description taken in connection with accompanying drawings wherein like reference characters refer to like elements.

DESCRIPTION OF THE PREFERRED EMBODIMENT

Figure 1:
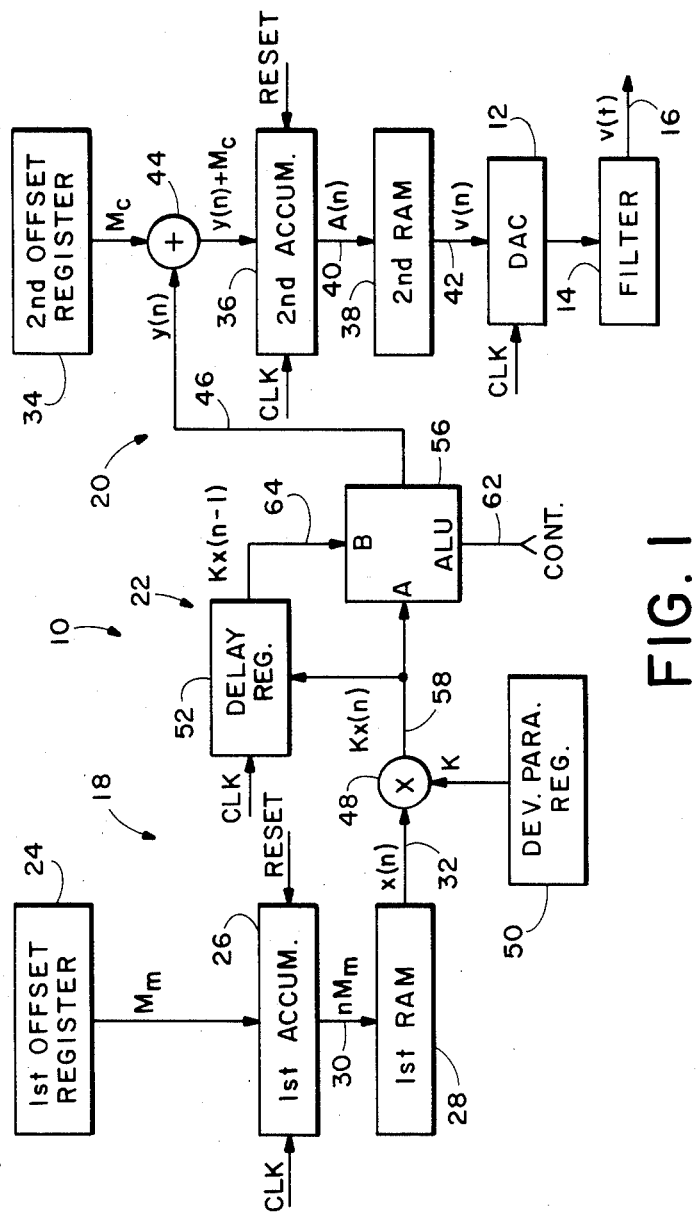
FIG. 1 is a block diagram of an angle modulated waveform synthesizer according to the present invention.

Referring to FIG. 1, an angle modulated waveform synthesizer 10, illustrated in block diagram form, is adapted to generate a sequence of digital data v(n) of magnitude which varies with the number n of regular system clock (CLK) pulses such that when the v(n) data is converted to analog quantities of proportional magnitude by a D/A converter 12, and subsequently smoothed by filtering circuit 14, a resulting waveform v(t) appearing at output terminal 16 is an angle modulated periodic waveform.

The angle modulated waveform synthesizer 10 comprises a first digital waveform synthesizer 18 and a second digital waveform synthesizer 20 interconnected by a modulation control circuit 22. First digital waveform synthesizer 18 comprises first offset register 24, first accumulator 26 and first RAM 28. A selected binary modulator waveform frequency parameter $M_m$ is stored in register 24 prior to circuit operation. This parameter is applied to the input terminals of first accumulator 26. Each time first accumulator 26 is strobed by a clock pulse CLK from a system clock (not shown), first accumulator 26 increases an internally stored binary number by the amount of $M_m$. The number stored by first accumulator 26 may be reset to a binary 0 by application of an externally generated RESET pulse. If n is the number of CLK pulses since the last RESET pulse, then the number stored by first accumulator 26 after the $n^{th}$ CLK pulse equals $nM_m$. The number thus accumulated by first accumulator 26 is carried on an addressing input but 30 to first RAM 28 such that when first RAM 28 is in a read mode, data stored by first RAM 28 at the current address on bus 30 appears on first RAM 28 data output bus 32 having a magnitude a function x(n) of the number of CLK pulses since RESET.

Second digital waveform synthesizer 20, similar to first digital waveform synthesizer 18 comprises second offset register 34, second accumulator 36 and second RAM 38. A selected binary carrier frequency parameter $M_c$ is stored in second offset register 34 prior to circuit operation. $M_c$ is then added by summing circuit 44 to an output y(n) of modulation control circuit 22 appearing on bus 46. The resulting sum, the output of summing circuit 44, is transmitted to the input of second accumulator 36. Each time second accumulator 36 is strobed by a clock pulse CLK second accumulator 36 increases an internally stored binary number A(n) by the amount of $M_c+y(n)$ appearing at its input terminals. The number A(n) stored by second accumulator 36 is carried by the addressing bus 40 to second RAM 38 such that when second RAM 38 is in a read mode, data stored by second RAM 38 at the current address A(n) appears on second RAM 38 data output bus 42 as a function v(n) of the number of CLK pulses since RESET.

Prior to circuit operation, first RAM 28 is loaded with data such that, as it is sequentially addressed by unit steps ($M_m = 1$), the magnitude of x(n) varies periodically with n, passing through one complete cycle as n increases from 0 to N, where N equals the range of first accumulator 26 and the number of first RAM storage locations. Second RAM 38 is also loaded with data in a similar fashion such that v(n) also passes through one complete cycle when the RAM address is incremented by single steps from 0 to N where N is also the range of second accumulator 36 and the number of second RAM storage locations. For purposes of illustration it is assumed that both RAMS are loaded with data whereby they produce output data of magnitude varying as regular sine waves as their addresses are stepped. With both RAMS so loaded, the periods of oscillation of such output data are inversely proportional to the step sizes used to increment the RAM addresses. It follows that the period of oscillation of x(n) on bus 32 is inversely proportional to the magnitude of the $M_m$ parameter stored in register 24. Similarly, the period of oscillation of data v(n) appearing on data bus 42 from second RAM 38 is inversely proportional to the sum of y(n) and $M_c$ applied to the input of second accumulator 36.

Modulation control circuit 22 comprises summing circuit 44, multiplier circuit 48, deviation parameter register 50, delay register 52, and arithmetic logic unit (ALU) 56. The output x(n) of digital waveform synthesizer 18 on bus 32 is multiplied by multiplier 48 with a binary deviation constant K stored in deviation parameter register 50 with the result appearing on bus 58 connected to both an input of delay register 52 and an A input of ALU 56. Delay register 52 stores the last data Kx(n−1) appearing on bus 58 at the time of the last CLK pulse and places the stored data on bus 64, attached to a B input of ALU 56. The stored data is replaced with the current data on bus 58 at the end of each CLK cycle. Depending on the sense of FM/PM control input 62 of ALU 56, the output y(n) of ALU 56 on line 46 is equal either to the sum of the A and B inputs or to the difference between the A and B inputs. Therefore $$y(n) = K(x(n) + x(n-1))$$

or $$y(n) = K(x(n) - x(n-1)).$$

Since y(n) varies with respect to n, y(n) will have a modulating effect on v(n) and v(t). An angle modulated periodic function may be of the form $$v(t) = f(w_c t + a(t))$$

where f is any periodic function, $w_c$ is the angular frequency constant, and a(t) is an angular modulating function of time t. For example, if v(t) is a phase modulated sine wave, then v(t) is of the form $$v(t) = \sin(w_c t + K'x(t)) \qquad [1]$$

where $x(t)$ is any unit magnitude periodic function of t and K is a constant. Alternatively, if $v(t)$ is a frequency modulated sine wave, then $v(t)$ is of the form $$v(t) = \sin\left(w_c t + K' \int_0^t x(t)dt\right) \quad [2]$$

Assuming, by way of example, that $x(t)=\sin(w_m t)$ where $w_m$ is the modulating frequency, then for frequency modulated sine waves, $$v(t) = \sin\left(w_c t + K' \int_0^t \sin(w_m t)dt\right) \quad [3]$$

and for phase modulated sine waves, $$v(t) = \sin(w_c t + K' \sin(w_m t)) \quad [4]$$

The waveforms $v(t)$ of equations [3] or [4] may be generated at the output terminal 16 of waveform synthesizer 10 by appropriately adjusting the data stored in first RAM 28, second RAM 38, deviation parameter register 50, and offset registers 24 and 34.

If the number stored by first accumulator 26 is initially set to 0 by an applied RESET pulse, then the output of first accumulator 26 on bus 30 after n CLK pulses is $nM_m$. Assuming that N is the range of first accumulator 26, and that the data in first RAM 28 is adjusted to produce ouput data on bus 32 varying in magnitude in a sine wave fashion with respect to a stepped address, with the output data magnitude passing through one cycle as $nM_m$ increases from 0 to N, the output of first RAM 28 will be $$x(n)=\sin(2\pi n M_m/N) \quad [5]$$

where $2\pi/N$ is the phase resolution associated with a unit RAM address change. With $x(n)$ and the binary number K, stored in register 50, applied to the inputs of multiplier 48, the output of multiplier 48 on bus 58 is $Kx(n)$. At any given number of CLK pulses n, the number stored by delay register 52 is $Kx(n-1)$. ALU 56 operation is adjusted by application of the appropriate bit on control line 62 such that the A and B inputs to ALU 56 are differenced or summed, whereby the ALU 56 output $y(n)$ on bus 46, is for frequency modulated waveforms, $$y(n)=A+B=(K/2)(x(n)+x(n-1)) \quad [6]$$

or, for phase modulated waveforms, $$v(n)=A-B=K(x(n)-x(n-1)) \quad [7]$$

It is noted that for A and B summed, the stored binary deviation must be halved.

$y(n)$ and $M_c$ are summed by summing circuit 44 and applied to the input of second accumulator 36 such that the output of second accumulator 36 on addressing bus 40 is $$A(n) = \sum_{j=o}^{n} (M_c + y(j))$$

If second RAM 38 is loaded such that $$v(n) = \sin(2\pi A(n)/N)$$

then $$v(n) = \sin\left[(2\pi/N) \sum_{j=o}^{n} (M_c + y(j))\right]$$

or equivalently $$v(n) = \sin\left[(2\pi/N) M_c n + (2\pi/N) \sum_{j=o}^{n} y(j)\right]$$

The angular carrier frequency, $w_c$, is defined as $$w_c = 2\pi M_c/(N\Delta t) \quad [8]$$

where $\Delta t$ is the time between each clock pulse, and therefore $$v(n) = \sin\left[w_c n\Delta t + (2\pi/N) \sum_{j=o}^{n} y(j)\right] \quad [9]$$

From [6] for frequency modulated waveforms, $$\sum_{j=o}^{n} y(j) = \sum_{j=o}^{n} (K/2)(x(j) + x(j-1)) \simeq (K/\Delta t) \int_o^{n\Delta t} x(t)dt \quad [10]$$

the approximation being the trapezoidal rule of numerical integration, and from [7] for phase modulated waveforms $$\sum_{j=o}^{n} y(j) = \sum_{j=o}^{n} K(x(j) - x(j-1)) = Kx(n) \quad [11]$$

Combining [9] and [10], for frequency modulated waveforms $$v(n) = \sin\left[w_c n\Delta t + (2\pi K/(N\Delta t)) \int_o^{n\Delta t} x(t)dt\right] \quad [12]$$

Noting that the deviation value K is an offset value similar to $M_c$ in [8], define the frequency deviation constant as $$K' = 2\pi K/(N t)$$

so that $$v(n) = \sin\left[w_c n\Delta t + K' \int_o^{n\Delta t} x(t)dt\right] \quad [13]$$

Substituting $t=n\Delta t$ into [13] and [5], letting $$w_m = 2\pi M_m/(n\Delta t) \quad \text{in [5]}$$

so that $$x(t)=\sin(w_m t) \quad [14]$$

and substituting [14] into [13] yields the desired continuous time expression $$v(t) = \sin(w_c t + K' \int_0^t \sin(w_m t)dt \quad [15]$$

From equations [9] and [11], for phase modulated waveforms, $$v(t) = \sin(w_c n\Delta t + 2\pi K/N\, x(n)) \quad [16]$$

Substituting equation [5] into equation [16] and letting $w_m = (2\pi M_m/N\Delta t)$, $t = n\Delta t$ and $K' = (2\pi K/N)$ $$v(t) = \sin(w_c t + K' \sin(w_m t)) \quad [17]$$

Equations [15] and [17] are of the proper form for frequency and phase modulated waveforms as indicated by equations [1] and [2]. Thus in order to generate a waveform of the form of equation [15] or [17] it is necessary to store in register 24 the number, $$M_m = w_m N\Delta t/2$$

and to store in register 34 the number, $$M_c = w_c N\Delta t/2$$

Additionally, if a frequency modulated waveform according to the equation [15] is to be synthesized, it is necessary to store in register 50 the number $$K = K'N\Delta t/2\pi,$$

$K'$ = peak frequency deviation in rads per second per unit $x(t)$.

Alternatively, if a phase modulated waveform according to equation [17] is to be synthesized, it is necessary to store in register 50 the number $$K = K'N/2\pi,$$

$K'$ = peak phase deviation in rads per unit $x(t)$.

In either case, the time between successive clock pulse leading edges should be set at $\Delta t$. In the preferred embodiment, as described hereinabove, both the carrier and modulating functions associated with $v(t)$ were in the form of sine waves. However, frequency or phase modulated waveforms oscillating according to any combination of periodic carrier or modulating functions of the form $$v(t) = f(w_c t + a(t))$$

may be generated by the waveform synthesizer of the present invention. The desired periodic carrier function f is obtained by loading the appropriate data into RAM 38 such that v(n) approximates the desired carrier function when $M_c = 1$ and $y(n) = 0$. Similarly, any desired periodic modulating function $a(t)$ is obtained by loading the appropriate data into RAM 28 such that, in the case of a phase modulated v(t), x(n) approximates the desired modulating function $a(t)$ with $M_m = 1$, or such that, in the case of a frequency modulated v(t), x(n) approximates the derivative of the desired modulating function $a(t)$ when $M_m = 1$.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An apparatus responsive to a modulation parameter and a carrier parameter for synthesizing an angle modulated waveform, said apparatus comprising:

first means responsive to the modulation parameter for generating a first number sequence oscillating at a frequency controlled by the modulation, second means responsive to said first number sequence and said carrier parameter for generating a second number sequence, each number of said second number sequence being an arithmetical combination of numbers of said first number sequence and the carrier parameter, and third means responsive to the second number sequence for generating a third number sequence, each number of said third number sequence being an accumulation of numbers of said second number sequence.

2. An apparatus responsive to a periodically occurring clock signal, a variable modulation parameter and a variable carrier parameter for synthesizing an angle modulated waveform, said apparatus comprising:

first means responsive to the modulation parameter and the clock signal for generating a first number sequence, one such number thereof being generated on each occurrence of said clock signal and having a magnitude which is a first periodic function of a product of a number of occurrences of said clock signal and a magnitude of the modulation parameter, second means responsive to said first number sequence and to the carrier parameter for generating a second number sequence, each number thereof having a magnitude which is an arithmetical combination of numbers of said first number sequence and the carrier parameter, and third means responsive to the second number sequence for generating a third number sequence, each number thereof having a magnitude which is a second periodic function of an accumulated sum of previously occurring numbers of said second number sequence.

3. An apparatus as in claim 2 wherein each number of said second number sequence is proportional to a sum of said carrier parameter and a sum of two most recent numbers of said first number sequence.

4. An apparatus in claim 2 wherein each number of said second number sequence is proportional to a sum of said carrier parameter and a difference between two numbers of said first number sequence.

5. An apparatus as in claim 2 wherein each number of said second number sequence is selectively either proportional to a sum of said carrier parameter and a sum of two numbers of said first number sequence or proportional to a sum of said carrier parameter and a difference between two numbers of said first number sequence.

6. An apparatus responsive to a periodically occurring clock signal, a modulation parameter, and a carrier parameter for synthesizing an angle modulated waveform, said apparatus comprising:

means for storing an address number, means for increasing said stored address number by the modulation parameter on each occurrence of the clock signal, first means responsive to said stored address number for generating a first number sequence having a magnitude which is a first periodic function of said first stored address number, second means for generating a second number sequence having a magnitude which is a second function of said first number sequence and the carrier parameter and third means for generating a third number sequence having a magnitude which is a third periodic function of an accumulated sum of numbers of said second number sequence.

7. An apparatus as in claim 6 wherein said first means comprises an addressable memory circuit, said stored address number being applied to address said addressable memory circuit, each number of said first number sequence being stored at an address such that the magnitude of each number of said first number sequence is determined by said first periodic function of said stored address number.

8. An apparatus as in claim 6 wherein said second means comprises:

means for storing a product of a constant and a next most recent number of said first number sequence, means for generating a sum number on each occurrence of said clock signal by adding said stored product to a product of said constant and a most recent number of said first number sequence, and means for generating the second number sequence, each number thereof being a sum of one said sum number and said carrier parameter.

9. An apparatus as in claim 6 wherein said second means comprises:

means for storing a next most recent number of said first number sequence, means for generating a difference number on each occurrence of said clock signal by subtracting said stored next most recent number from a most recent number of said first number sequence, and means for generating the second number sequence, each number thereof being a sum of one said difference number and said carrier parameter.

10. An apparatus as in claim 6 wherein said means for generating a third number sequence comprises a second addressable memory circuit, said second number sequence being applied to address said second addressable memory circuit.

11. An apparatus responsive to a periodically occurring clock signal, an adjustable modulation parameter, and an adjustable carrier parameter for synthesizing an angle modulated waveform, said apparatus comprising:

means for storing a first address number, means for increasing the stored first address number by the modulation parameter on each occurrence of the clock signal, a first addressable memory circuit for storing and generating a first number sequence, said stored first address number being applied to address said first addressable memory circuit, numbers of the first number sequence being stored at addresses in said first addressable memory circuit such that each number of said first number sequence is of a magnitude determined by a first periodic function of the address at which it is stored, means for storing a second address number, means for increasing the stored second address number on each occurrence of said clock signal by a sum of said carrier parameter, and two most recent numbers of said first number sequence, and a second addressable memory circuit for storing and generating a second number sequence, said second address number being applied to address said second addressable memory circuit, numbers of the second number sequence being stored at addresses in said second addressable memory such that each number of said second number sequence is of a magnitude determined by a second periodic function of its address.

12. A method for synthesizing an angle modulated waveform comprising the steps of:

generating a first number sequence, a next number thereof being generated on each occurrence of a periodic clock signal and having a magnitude which is a first periodic function of a number of previous occurrences of said clock signal, generating a second number sequence, a next number thereof being generated on each occurrence said clock signal and having a magnitude which is an arithmetical combination of prior occurring numbers of said first number sequence and a carrier parameter, accumulating a sum of numbers of said second number sequence, and generating a third number sequence, a number thereof being generated on each occurrence of said clock signal and having a magnitude which is a second periodic function of the accumulated sum.

13. The method of claim 12 wherein each number of said second number sequence is proportional to a sum of said carrier parameter and a sum of two numbers of said first number sequence.

14. The method of claim 12 wherein each number of said second number sequence is proportional to a sum of said carrier parameter and a difference between two numbers of said first number sequence.

15. The method of claim 12 wherein each number of said second number sequence is selectively either proportional to a sum of said carrier parameter and a sum of two numbers of said first number sequence or proportional to a sum of said carrier parameter and a difference between two numbers of said first number sequence.

16. A method for synthesizing an angle modulated waveform, said method comprising the steps of:

generating a first number sequence, each number thereof being generated on occurrence of a periodic clock signal and having a magnitude which is a first periodic function of a number of occurrences of said clock signal since occurrence of a reset signal, generating a second number sequence, each number thereof being generated on occurrence of said clock signal and having a magnitude which is a second function of prior occurring numbers of said first number sequence and an applied carrier parameter, storing a number, adding each number of said second number sequence to said stored number, and generating a third number sequence, each number thereof being generated on each occurrence of said clock signal and having a magnitude which is a third periodic function of said stored number.

17. A waveform synthesizer responsive to an adjustable modulation parameter and an adjustable carrier parameter, said synthesizer comprising:

first means responsive to said modulation parameter for generating a first number sequence of magnitude that oscillates at a first frequency controlled by said modulation parameter;

second means responsive to the first number sequence for generating a second number sequence wherein each number of the second number sequence is proportional to an arithmetical combination of preceding numbers of the first number sequence;

third means for accumulating a sum of the carrier parameter and each number of the second sequence to produce a third number sequence; and a periodic wave lookup table for producing in response to the third number sequence an output number sequence of magnitude that oscillates at a carrier frequency in accordance with said carrier parameter modulated at a modulation frequency in accordance with said modulation parameter.

18. The waveform synthesizer in accordance with claim 17 further comprising digital-to-analog conversion means for converting said output number sequence into an analog signal of magnitude that oscillates in accordance with the magnitude of said output number sequence.

* * * * *